US006781462B2

(12) United States Patent
Hwang et al.

(10) Patent No.: US 6,781,462 B2
(45) Date of Patent: Aug. 24, 2004

(54) POWER AMPLIFIER

(75) Inventors: Jong-Tae Hwang, Seoul (KR); Han-Seung Lee, Seoul (KR)

(73) Assignee: Fairchild Korea Semiconductor, Bucheon (KR)

( * ) Notice: Subject to any disclaimer, the term of this patent is extended or adjusted under 35 U.S.C. 154(b) by 101 days.

(21) Appl. No.: 10/136,971

(22) Filed: Apr. 30, 2002

(65) Prior Publication Data

US 2003/0076171 A1 Apr. 24, 2003

(30) Foreign Application Priority Data

Oct. 23, 2001 (KR) .................................. 10-2001-65325

(51) Int. Cl.[7] .............................................. H03F 3/45
(52) U.S. Cl. ....................................... 330/255; 330/253
(58) Field of Search ................................. 330/253, 255, 330/257, 260, 261, 252, 258

(56) References Cited

U.S. PATENT DOCUMENTS 4,241,313 A * 12/1980 Takehara .................... 330/253
5,467,058 A * 11/1995 Fujita ......................... 330/267
5,900,780 A * 5/1999 Hirose et al. ............... 330/253

* cited by examiner

*Primary Examiner*—Henry Choe
(74) *Attorney, Agent, or Firm*—Kenneth E. Horton; Kirton & McConkie

(57) ABSTRACT

A power amplifier that utilizes a minimum amount of power, and, simultaneously, inhibits the generation of distortion is described. The power amplifier includes a differential input terminal, an output terminal, a negative feedback circuit, and an adaptive bias current control circuit. The differential input terminal receives a first voltage and a second voltage respectively through a first terminal and a second terminal, and outputs a current corresponding to a difference in the input voltages. The output terminal outputs an amplified signal corresponding to the current output by the differential input terminal. The negative feedback circuit performs negative feedback of an output voltage of the output terminal and provides the output voltage to the first terminal of the differential input terminal. The adaptive bias current control circuit controls a bias current of the output terminal according to distortion information corresponding to the difference between the first voltage and the second voltage. Using the power amplifier, the bias current of the output terminal is increased when crossover distortion is severe, and decreases the bias current of the output terminal when there is no signal and no distortion. Thus, the level of power consumption is reduced and the generation of distortion is prevented.

29 Claims, 7 Drawing Sheets

Output waveform of class-AB power amplifier caused by crossover distortion

Control signal for bias current

Output waveform of class-AB power amplifier using adaptive bias current control circuit

POWER AMPLIFIER

FIELD OF THE INVENTION

The invention generally relates to semiconductor devices and methods for fabricating such devices. More particularly, the invention relates to a power amplifier, and more particularly, to a power amplifier that controls a bias current of an output terminal.

BACKGROUND OF THE INVENTION

Power amplifiers are often capable of manipulating a voice bandwidth and, therefore, are used in portable electronic devices such as cellular phones. These power amplifiers must be able to both inhibit the generation of distortion, as well as use a minimum amount of power.

Power amplifiers contain many components, including an output terminal. The structure of the output terminal plays an important role in determining whether (and to what extent) the power amplifier is able to prevent distortion and operate at low levels of power. For example, a conventional class AB output terminal that is able to suppress the generation of distortion and that consumes a low level of power is described and illustrated in FIG. 1.

As shown in FIG. 1, base voltages of NPN bipolar transistor Q1 and of PNP bipolar transistor Q2 are biased by diodes D1 and D2, respectively. Accordingly, the NPN and PNP transistors Q1 and Q2 are always switched on. By adjusting a current source IB when there is no signal (a current flowing to the output terminal when there is no signal is referred to as a Q current), a bias current applied to the NPN and PNP transistors Q1 and Q2 can be varied.

In an ideal circuit, the output terminal should not generate any distortion. However, in an actual circuit, the base voltages are determined so that a suitable current flows to the NPN and PNP transistors Q1 and Q2. Thus, a certain amount of time is required to alter the base voltages to avoid an abrupt flow of current or if no current is to flow at all. This time delay causes the generation of crossover distortion.

Crossover distortion is particularly severe when there is a large load or when a signal of a high frequency is applied. When there is a large load, the current that must be supplied to the load is extremely large. Thus, distortion increases because of the inability of the output transistor to abruptly supply current. Where a signal of a high frequency is applied, a push-pull operation of the output transistor must occur very quickly. However, because of the delay that typically occurs, crossover distortion increases.

To prevent such time delay, it is necessary to increase the bias current (Q current) so that a large current flows to the output terminal when there is no signal, thereby decreasing the time required to obtain a desired current. While increasing the bias current to the output terminal is effective in preventing the occurrence of distortion, a large amount of power is unfortunately consumed as a result.

SUMMARY OF THE INVENTION

The invention provides a power amplifier that simultaneously uses a minimum amount of power while preventing the generation of distortion. The power amplifier increases a bias current of an output terminal when a crossover distortion is severe, and decreases the bias current of the output terminal when there is no signal and no distortion.

In one aspect, the invention provides a power amplifier including: a differential input terminal for receiving a first voltage and a second voltage respectively through a first terminal and a second terminal, and for outputting a current corresponding to a difference in the input voltages; an output terminal for outputting an amplified signal corresponding to the current output by the differential input terminal; a negative feedback circuit for performing negative feedback of an output voltage of the output terminal and for providing the output voltage to the first terminal of the differential input terminal; and an adaptive bias current control circuit for controlling a bias current of the output terminal according to distortion information corresponding to the difference between the first voltage and the second voltage.

In one aspect of the invention, the output terminal can comprise: an output transistor unit including first and second transistors that supply a current to a load; first and second variable current sources controlled by an adaptive bias current control circuit; first and second current sources provided by the differential input terminal; a first control transistor unit that responds to the first variable current source and the first current source, and that controls an input voltage of the first transistor; and a second control transistor unit that responds to the second variable current source and the second current source, and that controls the second transistor, where the first and second control transistor units control a bias current flowing to the output transistor unit when there is no signal.

In one aspect of the invention, the differential input terminal comprises: a third transistor and a fourth transistor, the third transistor including a gate to which a first voltage is applied and which outputs a current corresponding to the first voltage, and the fourth transistor including a gate to which the second voltage is applied and which outputs a current corresponding to the second voltage; a third current source connected to the sources of the third and fourth transistors; a fifth transistor for copying a drain current of the third transistor and supplying to the output terminal a current corresponding to a current output by the second current source; and a sixth transistor for copying a drain current of the fourth transistor and supplying to the output terminal a current corresponding to a current output by the first current source.

In one aspect of the invention, the adaptive bias current control circuit can comprise: a distortion sensor for obtaining and outputting distortion information from a difference between the second voltage input to the second terminal of the differential input terminal and the first voltage that is input with the feedback of the output voltage of the output terminal; an absolute value circuit for outputting an absolute value of the distortion information output by the distortion sensor; and a distortion signal amplifier for receiving the absolute value of the distortion information output by the absolute value circuit and for outputting a control signal for controlling the first and second variable current sources.

BRIEF DESCRIPTION OF THE DRAWINGS

FIGS. 1–10 are views of semiconductor devices and methods for making such devices according to the invention, in which:

FIG. 1 is a schematic view of a conventional AB class output terminal;

FIG. 2 is a block diagram of a power amplifier according to one aspect of the invention;

FIG. 3 is an exemplary drawing of the AB class output terminal illustrated in FIG. 2;

FIG. 4 is an exemplary drawing of the power amplifier depicted in FIG. 2;

FIG. 5 is a block diagram of the adaptive bias current control circuit shown in FIG. 2;

FIG. 6 is an exemplary drawing of the adaptive bias current control circuit illustrated in FIG. 5;

FIG. 7 is an exemplary drawing of the power amplifier depicted in FIG. 4 to which is applied an adaptive bias current control circuit according to one aspect of the present invention;

FIG. 8 is a graph showing an output waveform of a class AB power amplifier, in which there is crossover distortion in the output;

FIG. 9 is a graph showing a bias current waveform generated after the application of an adaptive bias current control circuit; and FIG. 10 is a graph showing the bias current waveform depicted in FIG. 9 following improvements with respect to crossover distortion using a control current.

FIGS. 1–10 presented in conjunction with this description are views of only particular—rather than complete—portions of semiconductor devices and methods for making such devices according to the invention. Together with the following description, the Figures demonstrate and explain the principles of the invention.

DETAILED DESCRIPTION OF THE INVENTION

The following description discloses specific details in order to provide a thorough understanding of the invention. The skilled artisan will understand, however, that the invention can be practiced without employing these specific details. Indeed, the invention can be practiced by modifying the illustrated devices and methods and can be used in conjunction with devices and methods conventionally used in the industry.

Figure 2:
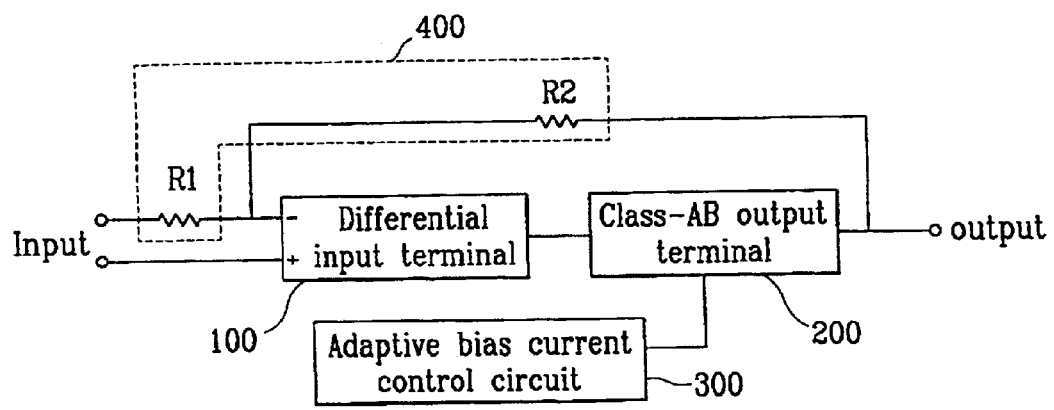

FIG. 2 depicts a block diagram of a power amplifier according to one aspect of the invention. As shown in FIG. 2, a power amplifier in this aspect of the invention includes a differential input terminal 100 receiving an input voltage through an inverting terminal and a non-inverting terminal. Input terminal 100 also outputs a current corresponding to a difference in the input voltages. The power amplifier also includes a class AB output terminal 200 for outputting an amplified output signal corresponding to the current output from the differential input terminal 100. The power amplifier also includes an adaptive bias current control circuit 300 for controlling a bias current of the class AB output terminal 200. Finally, the power amplifier also includes a negative feedback circuit 400 for performing negative feedback of an output voltage of the class AB output terminal 200.

The operation and structure of the power amplifier are described with reference to the individual components mentioned above. The class AB output terminal 200 is described in detail with reference to FIG. 3, which is an exemplary drawing of the class AB output terminal 200 shown in FIG. 2.

Figure 3:
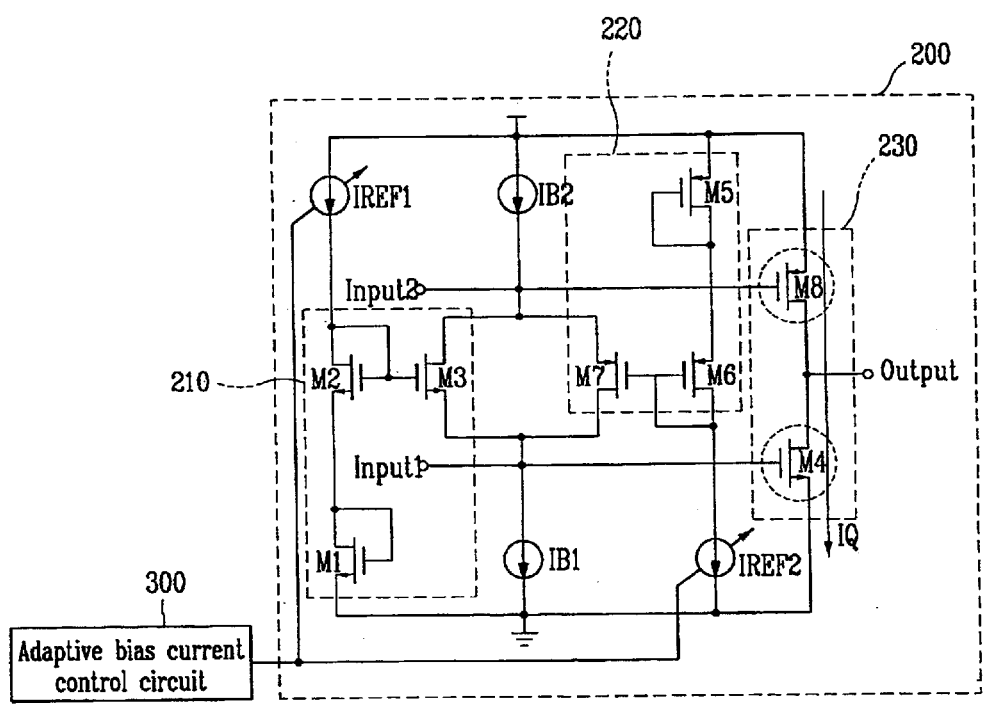

The class AB output terminal 200 according to one aspect of the invention includes a first control transistor unit 210, a second control transistor unit 220, an output transistor unit 230, current sources IB1 and IB2, and variable current sources IREF1 and IREF2. The output transistor unit 230 ensures that a sufficient current is supplied to a load and uses a CMOS realized through a very large P-type power transistor M8 and an N-type power transistor M4. As shown in FIG. 3, a structure where a source is grounded is obtained by using the CMOS in a preferred aspect of the invention.

Figure 1:
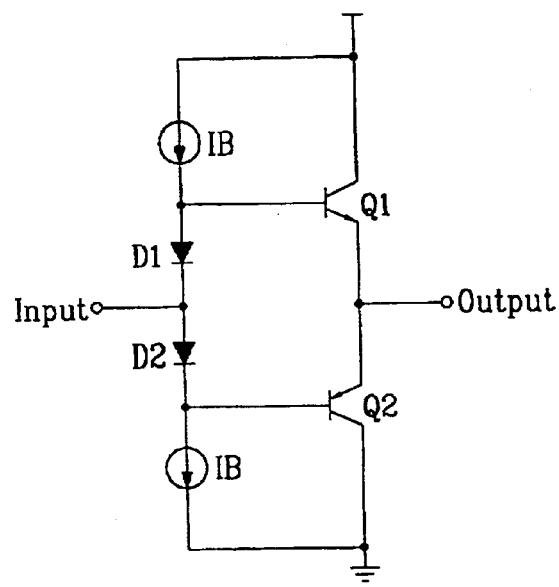

Such a design as described above allows for as large a swing of output voltage as possible so that a sufficient power is supplied to the load from a limited source voltage. When using bipolar junction transistors (BJTs), as in the conventional AB class output terminal shown in FIG. 1, the range of the output voltage is small since an output voltage of a PNP transistor Q2 is restricted by a base-emitter voltage. Since the source is grounded using a CMOS in the invention, the output voltage swing can be made large.

By using power transistors M4 and M8 in the output transistor unit 230 to supply a large current to the load, an extremely large Q current may develop when there is no signal if the gate voltages of the transistors M4 and M8 are incorrectly established. Accordingly, in the aspect of the invention as shown in FIG. 3, the first control transistor unit 210 and the second control transistor unit 220 are used to control the Q current. The first control transistor unit 210 includes N-type MOS transistors M2 and M3, the gates of which are interconnected. The first control transistor 210 also contains an N-type MOS transistor M1, the gate and drain of which are connected to a source of the transistor M2. The variable current source IREF1 is connected to the gate and a drain of the transistor M2.

The second control transistor unit 220 includes P-type MOS transistors M6 and M7, the gates of which are interconnected. The second control transistor unit 220 also includes a P-type MOS transistor M5, the gate and drain of which are connected to a source of the transistor M6. The variable current source IREF2 is connected to the gate and a drain of the transistor M6.

The class AB output terminal 200 operates in the following manner. The first control transistor unit 210 determines the gate voltage of the transistor M4 of the output transistor unit 230 in accordance with current values of the current source IB1 and the variable current source IREF1. The second control transistor unit 220 determines the gate voltage of the transistor M8 of the output transistor unit 230 in accordance with current values of the current source IB2 and the variable current source IREF2.

When there is no signal, the gate voltage of the transistor M4 is determined by a source voltage of the transistor M3. The source voltage of the transistor M3, in turn, is determined by the current source IB1 and a gate voltage of the transistor M3. Further, the gate voltage of the transistor M3 is determined by a gate-source voltage of the transistors M1 and M2. The gate-source voltage of the transistors M1 and M2 is related to the variable current source IREF1. Thus, if the current value of the variable current source IREF1 increases, the gate voltage of the transistor M3 becomes larger and the source voltage of the transistor M3 (which is connected to a gate of the transistor M4) also increases. As a result, the current of the transistor M4 is increased.

The transistors M5, M6, and M7 of the second control transistor unit 220 operate substantially similar to the transistors M1, M2, and M3 of the first control transistor unit 210. As a result, the bias current IQ passing through the transistors M4 and M8 of the output transistor unit 230 also increases. In this manner, the class AB output terminal according to this aspect of the invention adjusts the variable current sources IREF1 and IREF2, enabling adjustment of a level of the Q current passing through the transistors M4 and M8 of the output transistor unit 230 when there is a large load or when there is a high frequency signal.

Figure 4:
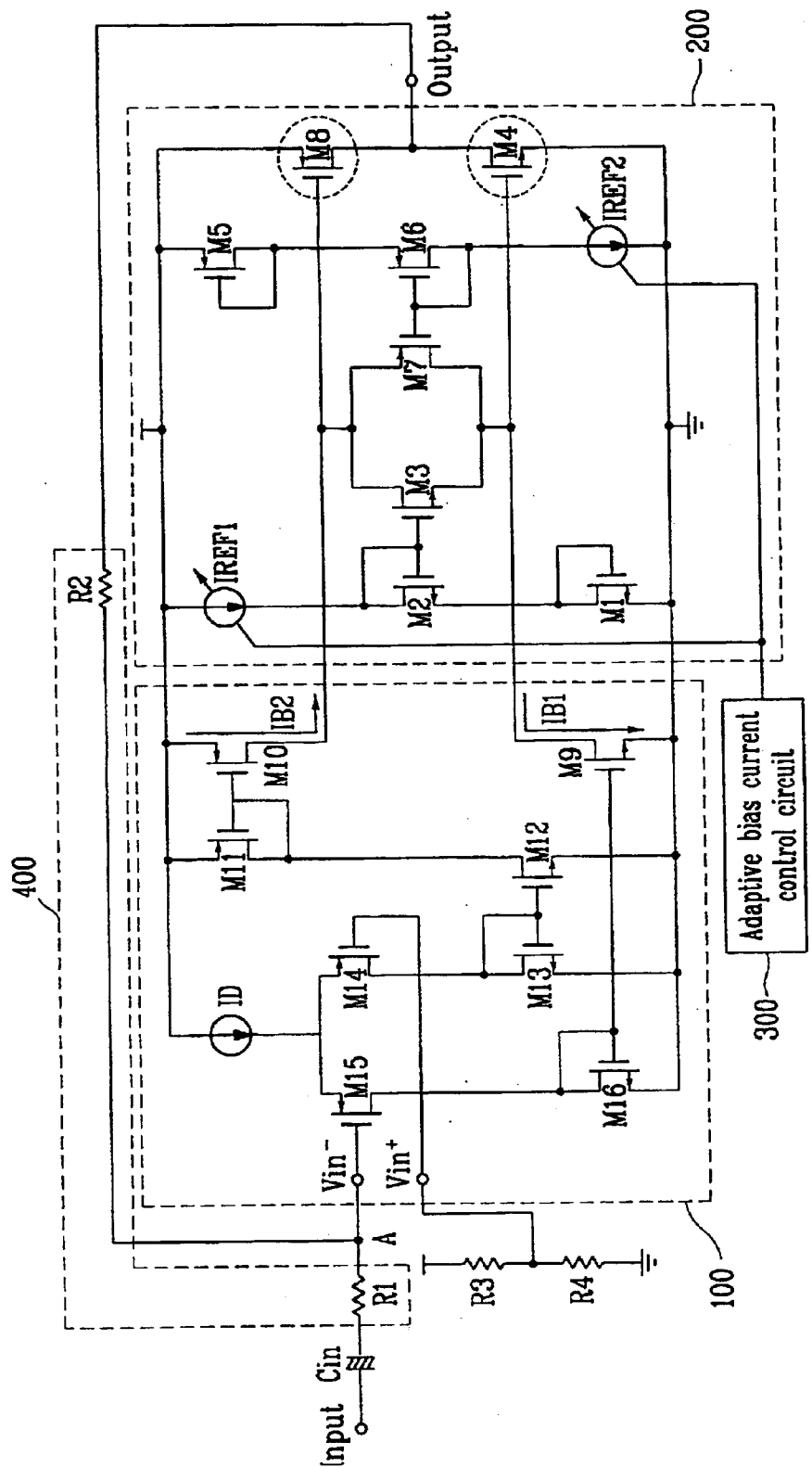

In one aspect of the invention, the power amplifier is depicted in FIG. 4. In FIG. 4, the differential input terminal 100 includes P-type MOS transistors M14 and M15 for receiving input voltages Vin− and Vin+, respectively, and for converting the input voltages Vin− and Vin+ into corresponding currents. The differential input terminal 100 also includes a bias current source ID for driving the transistors M14 and M15. The differential input terminal 100 contains MOS transistors M9, M10, M11, M12, M13, and M16 for transmitting to the class AB output terminal 300 the currents converted by the transistors M14 and M15 that correspond to the voltages Vin− and Vin+, as described above.

As shown in FIG. 4, the negative feedback circuit 400 includes the resistors R1 and R2 and has a gain of −R2/R1. A voltage corresponding to the output voltage of the class AB output terminal 200 undergoes feedback through the negative feedback circuit 400 and then is supplied to the inverting terminal of the differential input terminal 100.

The inverted input voltage Vin−, which is the gate voltage of the transistor M15, includes signal elements passed through a capacitor Cin and the voltage that undergoes feedback from the class AB output terminal 200. The non-inverted input voltage Vin+, which is the gate voltage of the transistor M14, is a DC voltage of a predetermined range that passes through resistors R2 and R3.

The power amplifier that receives such input signals operates in the following manner. The transistors M14 and M15 of the differential input terminal 100 output current values that correspond to the input voltages Vin− and Vin+, respectively, as described above. The differential input terminal 100 copies the drain current of the transistor M15 through the transistors M16 and M19 and supplies a current corresponding to the current of source IB1 to the class AB output terminal 200. The differential input terminal 100 also copies the drain current of the transistor M14 through the transistors M10, M11, M12, and M13, and supplies a current corresponding to the current of source IB2 to the class AB output terminal 200.

The voltages generated by the current sources IB1 and IB2, and by the variable current sources IREF1 and IREF2, determine the current passing through the transistors M4 and M8 of the output transistor unit 230. The variable current sources IREF1 and IREF2 control the adaptive bias current control circuit 300 as described below.

The bias current control circuit 300 controls the variable current sources IREF1 and IREF2 according to the severity of the output distortion. In other words, if the output distortion increases, the current IREF supplied from the variable current sources IREF1 and IREF2 is increased. On other hand, if there is no output distortion, the bias current control circuit 300 performs a control operation to maintain a predetermined value for the current IREF. In one aspect of the invention, the current IREF can be expressed by Equation 1:

$$IREF = IREF0 + k \times Vdist \quad \text{[Equation 1]}$$

where Vdist is a distorted voltage, k represents the degree of variation in the current IREF with respect to distortion, and IREF0 is the current IREF when there is no distortion.

Figure 5:
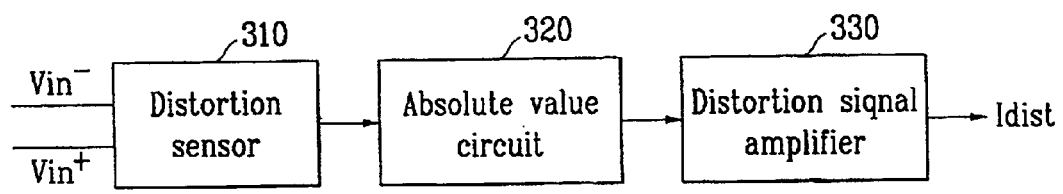

The adaptive bias current control circuit 300, which varies the current IREF, can be described with reference to FIG. 5, which is a block diagram of the adaptive bias current control circuit 300. The adaptive bias current control circuit 300 varies the current IREF of the variable current sources IREF1 and IREF2 according to distortion signal information. As shown in FIG. 5, the adaptive bias current control circuit 300 includes a distortion sensor 310, an absolute value circuit 320, and a distortion signal amplifier 330.

The distortion sensor 310 obtains distortion information from a difference in the input voltages of the differential input terminal 100. The absolute value circuit 320 obtains the information from the distortion sensor and then outputs an absolute value of that information output from the distortion sensor 310. The distortion signal amplifier 330 amplifies the absolute value of the distortion signal output from the absolute value circuit 320 and outputs a control current Idist to control the variable current sources IREF1 and IREF2.

Figure 6:
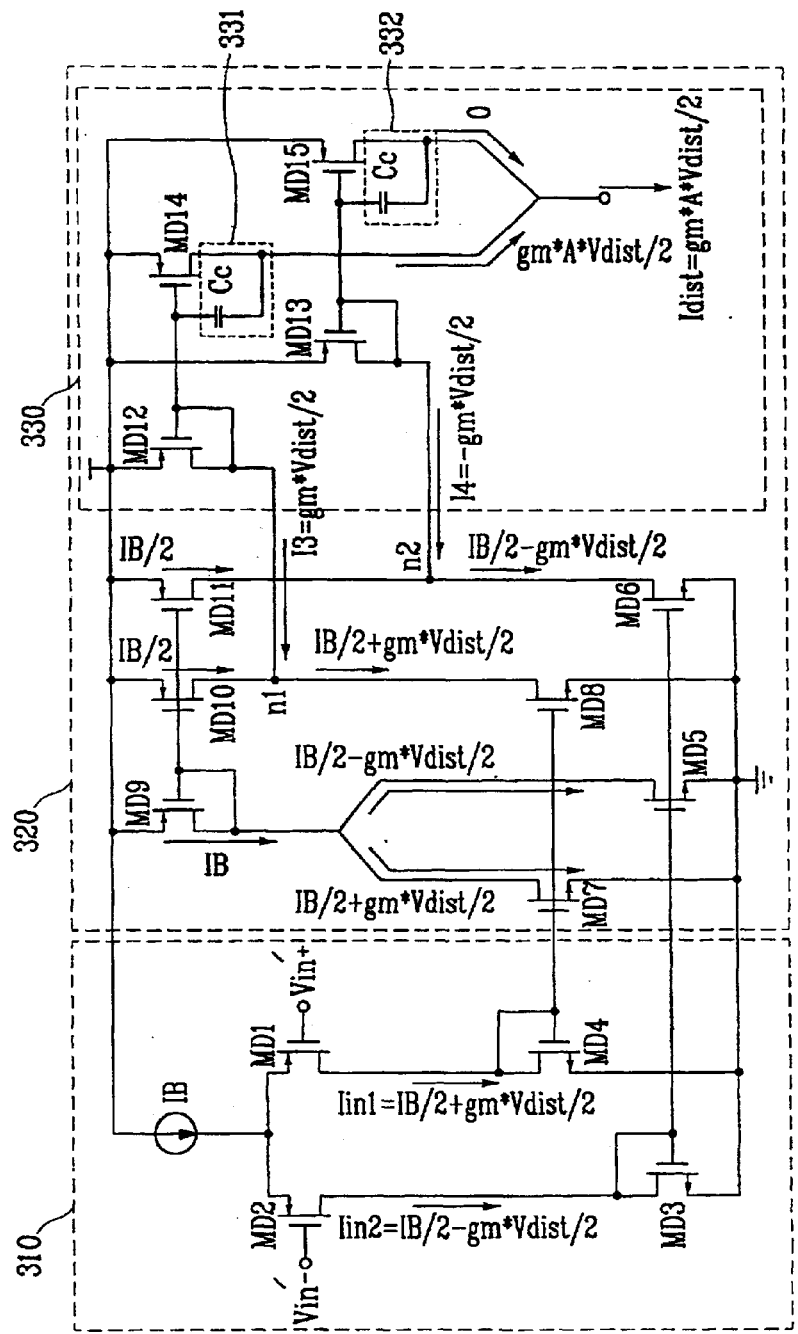

FIG. 6 shows an exemplary drawing of the adaptive bias current control circuit 300 in one aspect of the invention. A detailed circuit diagram of the distortion sensor 310, absolute value circuit 320, and distortion signal amplifier 330 is shown in FIG. 6.

Prior to the detailed description of the adaptive bias current control circuit 300, the principles behind why the difference in the input voltages of the differential input terminal 100 becomes the distortion voltage information will be described. In the power amplifier of FIG. 4, the output voltage undergoes feedback through the resistors R1 and R2, which are negative feedback resistors. Thus, the input voltage Vin− of the inverted terminal contains distortion voltage information.

In an ideal negative feedback amplifier, the input voltages Vin+ and Vin− would be equal in potential since they would display a virtual ground effect. In this case, no distortion is present in the output. Accordingly, if input voltages Vin+′ and Vin−′ of the adaptive bias current control circuit 300 are connected to the input voltages Vin+ and Vin− of the power amplifier, there is no difference in the drain currents of differential input terminal transistors MD1 and MD2 since the difference in the input voltages Vin+′ and Vin−′ for the ideal negative feedback amplifier is 0.

In an actual negative feedback amplifier, however, there occurs a difference in the input voltages Vin+ and Vin− because of the limited loop gain. This difference in the input voltages Vin+ and Vin− increases as the distortion becomes more severe. Therefore, the difference in the input voltages of the differential input terminal 100 becomes the distortion voltage information and the difference in the output currents becomes distortion current information. This may be verified mathematically in the following manner.

Output Vo of the power amplifier of FIG. 4 when there is no negative feedback may be expressed by Equation 2.

$$Vo = -\frac{R2}{R1}\frac{A}{1+A} Vin + Vo, dist \quad \text{Equation 2}$$

where A is the gain of the amplifier; Vin is the input with no distortion; and Vo,dist is the output distortion. Resistors R1 and R2 satisfy the following current relationship at node A of the inverted input terminal expressed in Equation 3:

$$\frac{(Vin-) - Vin}{R1} + \frac{(Vin-) - Vo}{R2} = 0. \quad \text{Equation 3}$$

The voltage relationship of node A can then derived as follows from Equations 2 and 3, and can be represented in Equation 4:

$$Vin- = \frac{R2}{R1+R2}\frac{1}{1+A} Vin + \frac{R1}{R1+R2} Vo, dist \quad \text{Equation 4}$$

If the gain A is sufficiently large, the quantity 1/(1+A) becomes small, and Equation 4 may be simplified to Equation 5:

$$Vin- \approx \frac{R1}{R1+R2} Vo, dist. \quad \text{Equation 5}$$

Therefore, a voltage proportional to the output distortion may be detected at node A of the inverted input terminal.

Returning to FIG. 6, the adaptive bias current control circuit 300 includes the distortion sensor 310, which uses the above principles to detect the level of distortion. The distortion sensor 310 includes the P-type MOS transistors MD1 and MD2, which output currents corresponding to the input voltages Vin+' and Vin-' respectively to the non-inverted input terminal and the inverted input terminal. The distortion sensor 310 also includes N-type MOS transistors MD3 and MD4 for copying the currents output from the transistors MD1 and MD2 to the subsequent stage, that is, to the absolute value circuit 320.

As shown in FIG. 6, the absolute value circuit 320 includes N-type transistors MD5 and MD6, which are of the same size as the transistor MD3 of the distortion sensor 310, and form a current mirror with the transistor MD3. The absolute value circuit 320 also includes N-type MOS transistors M7 and M8, which are of the same size as the transistor MD4 of the distortion sensor 310, and form a current mirror with the transistor MD4. The absolute value circuit 320 also contains a P-type MOS transistor MD9, a drain of which is connected to drains of the transistors MD7 and MD5, and which is of the same size as the transistors MD7 and MD5. The absolute value circuit 320 further includes P-type MOS transistors MD10 and MD11, which are ½ the size of the transistor MD9 and forms a current mirror with the same.

A drain of the transistor MD10 and a drain of the transistor MD8 are interconnected. The node n1 formed by this interconnection is connected to the distortion signal amplifier 330. Similarly, a drain of the transistor MD11 and a drain of the transistor MD6 are interconnected, and the node n2 formed by this connection is connected to the distortion signal amplifier 330.

The distortion signal amplifier 330 includes P-type MOS transistors MD12 and MD13. A drain and a gate of the transistor MD12 are both connected to the node n1, and a drain and a gate of the transistor MD13 are both connected to the node n2. The distortion signal amplifier 330 also includes a P-type MOS transistor MD14 that is "A" times larger than the transistor MD12. A gate of the transistor MD14 is connected to the gate of the transistor MD12. A capacitor Cc is connected between a gate and a drain of the transistor MD14. The distortion signal amplifier 330 includes also a P-type MOS transistor MD15, which is "A" times larger than the transistor MD13. A gate of the transistor MD15 is connected to a gate of the transistor MD13. A capacitor Cc is connected between a gate and a drain of the transistor MD15. "A" corresponds to a gain value of the distortion signal amplifier 330.

The adaptive bias current control circuit 300 structured as described above is operated in the following manner (still referring to FIG. 6). The voltage Vin+' input to the non-inverted input terminal of the distortion sensor 310 applies a predetermined DC voltage, as shown in FIG. Thus, a distortion voltage of the voltages Vin+' and Vin-' input respectively to the non-inverted input terminal and the inverted input terminal of the distortion sensor 310 results, as expressed in Equation 4 with the distortion voltage denoted as Vdist.

Where a transconductance of the differential input terminal realized through the transistors MD1 and MD2 is gm, and a distortion occurs between the input and output of the amplifier to be applied to the gate voltages Vin+' and Vin-' of the transistors MD1 and MD2 of the distortion sensor 310, a distortion current Id maybe expressed as in Equation 6:

$$Id = gm \times Vdist \quad \text{Equation 6}$$

Since the input distortion voltage of the transistors MD1 and MD2 comprising the differential input terminal is Vdist, currents Iin1 and Iin2 flowing respectively to drains of the transistors MD1 and MD2 can be expressed by Equations 7 and 8:

$$Iin1 = \frac{IB}{2} + gm \times \frac{Vdist}{2} \quad \text{Equation 7}$$

$$Iin2 = \frac{IB}{2} - gm \times \frac{Vdist}{2} \quad \text{Equation 8}$$

IB in Equations 7 and 8 is a bias current of the differential input terminal. That is, the currents Iin1 and Iin2 flowing to the drains of the transistors MD1 and MD2 vary according to the distortion voltage Vdist. And because identical gate voltages are applied to the transistors MD1 and MD2 if the distortion voltage Vdist input to the differential input terminal is 0 (Vdist=0), the currents Iin1 and Iin2 result in a value that is ½ the bias current IB.

The current Iin2 flowing to the drain of the transistor MD2 is copied in each of the transistors MD5 and MD6 of the absolute value circuit 320. The current Iin1 flowing to the drain of the transistor MD1 is copied in each of the transistors MD7 and MD8 of the absolute value circuit 320.

Since drains of the transistors MD5 and MD7 are both connected to the drain of the transistor MD9 in the absolute value circuit 320, differential current components of each of the transistors MD5 and MD7 disappear so that only the bias current IB flows to the drain of the transistor MD9. Because this current becomes a current of 0 when there is no distortion, the current also becomes a reference current for determining the degree of distortion. Half of this reference current is copied to each of the transistors MD10 and MD11 by the transistor MD9 because transistors MD10 and MD11 are half the size of the transistor MD9. The current (IB/2) copied to each of the transistors MD10 and MD11 is compared to the currents Iin1 and Iin2 flowing respectively to the drains of the transistors MD8 and MD6.

The differential component currents (I3=In1-IB/2 and I4=Iin2-IB/2) are then separated by the nodes n1 and n2 to flow to the distortion signal amplifier 330. Accordingly, the currents I3 and I4 flowing to the drains of the transistors MD12 and MD13 of the distortion signal amplifier 330 can be expressed respectively in Equations 9 and 10:

$$I3 = gm \times \frac{Vdist}{2} \quad \text{Equation 9}$$

$$I4 = -gm \times \frac{Vdist}{2} \quad \text{Equation 10}$$

The gate voltages of the transistors MD12 and MD13 are determined by the currents I3 and I4. The gate voltages enable currents amplified by "A" times by the transistors MD14 and MD15, which are "A" times larger than the transistors MD12 and MD13, to flow to the drains of the transistors MD14 and MD15. When the current of the transistor MD8 of the absolute value circuit 320 is larger than IB/2, the current I3 corresponding to the difference in these currents flows to the transistor MD12 of the distortion signal amplifier 330 and is amplified "A" times by the transistor MD14. On the other hand, when the current of the transistor MD6 of the absolute value circuit 320 is smaller than IB/2, the transistor MD13 is switched to OFF and the current of the transistor MD15 becomes zero.

If the sign of the distortion voltage Vdist changes, the distortion current is amplified by the transistors MD13 and MD15 and the current of the transistors MD12 and MD14 becomes zero. As a result, the amplified distortion current Idist, which is the output current, obtained can be expressed by Equation 11. The sign of the distortion voltage Vdist does not affect the resulting value of the distortion current since the absolute value of the distortion voltage Vdist is used.

$$Idist = gm \times A \times \frac{|Vdist|}{2} \qquad \text{Equation 11}$$

As described above, the capacitors Cc are connected between the gates and drains of each of the transistors MD14 and MD15. These capacitors Cc form frequency compensation circuits 331 and 332 for overcoming oscillation problems occurring when an operating frequency of the adaptive bias current control circuit 300 is limited and used together with a class AB amplifier.

Figure 7:
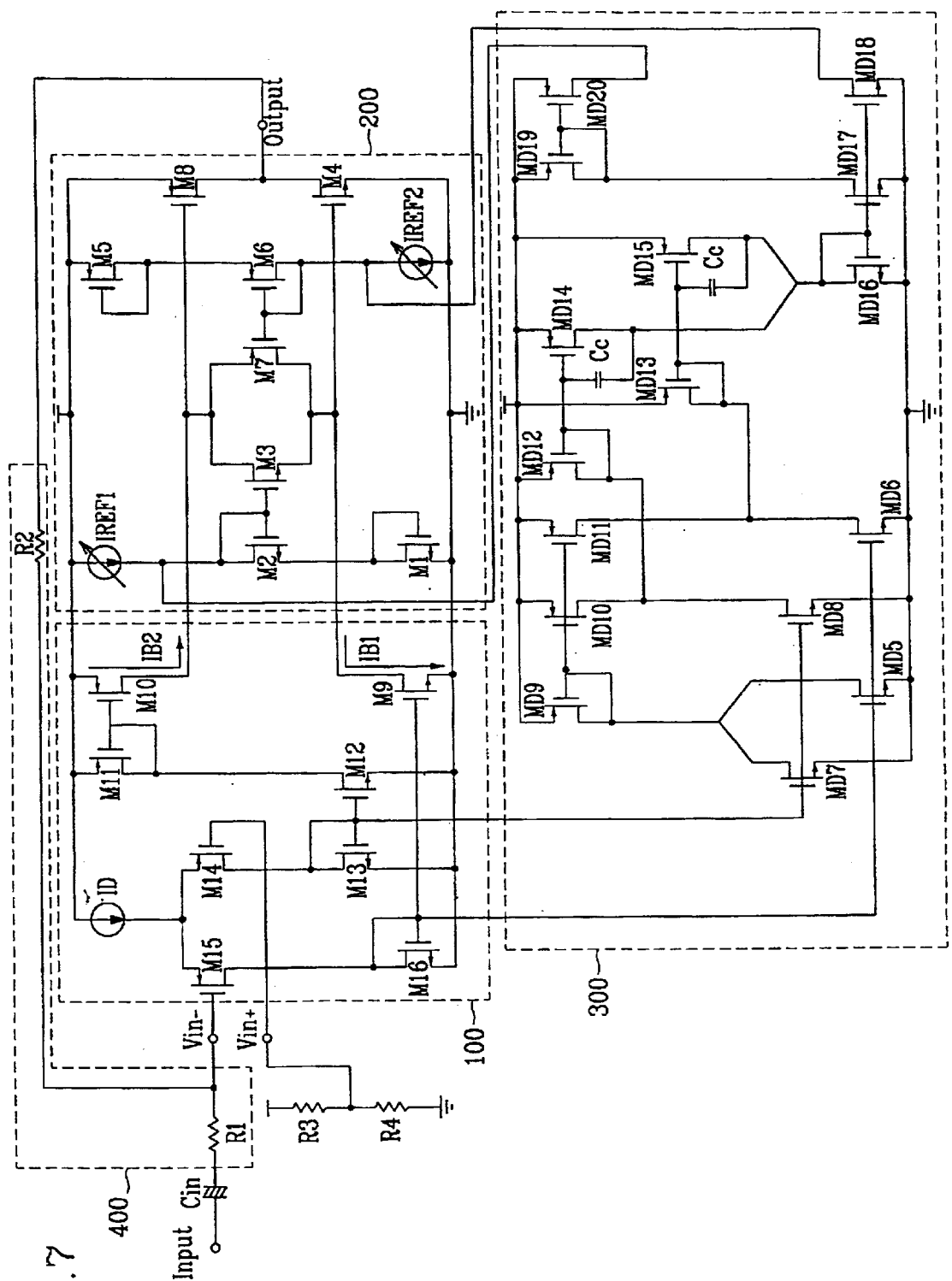

The power amplifier in one aspect of the invention that uses the adaptive bias current control circuit 300 is structured and operates as depicted in FIG. 7, which is an exemplary drawing of FIG. 4 to which the adaptive bias current control circuit 300 is applied. Referring to FIG. 7, the transistors M13, M14, M15, and M16 of the differential input terminal 100 of FIG. 4 (the transistors M13 and M16 being adaptive loads) perform the same function as the transistors MD1, MD2, MD3, and MD4 shown in FIG. 6. Therefore, these transistors MD1, MD2, MD3, and MD4 are not depicted in FIG. 7. In their place, transistors MD16, MD17, MD18, and MD19 are added for applying the current Idist generated by the adaptive bias current control circuit 300 to the class AB output terminal 200.

A drain current of the transistor MD16 is copied to the transistor MD17, and is again copied to the transistor MD20 by the transistor MD19. A drain of the transistor MD20 is connected to the drain of the transistor M2 of the class AB output terminal 200 to adaptively control the bias current of the transistor M4 (which is an output transistor). Further, the drain current of the transistor MD16 is copied to the transistor MD18, and the transistor MD18 is connected to the drain of the transistor M6 of the class AB output terminal 200 to actively control the bias current of the transistor M8 (which is an output transistor). Accordingly, the drain current of the transistors M2 and M6, which control the bias currents of the transistors M4 and M8, becomes a distortion voltage function detected in the differential input terminal 100 and can be expressed by Equation 12:

$$I = IREF0 + gm \times A \times \frac{|Vdist|}{2} \qquad \text{Equation 12}$$

Figure 8:
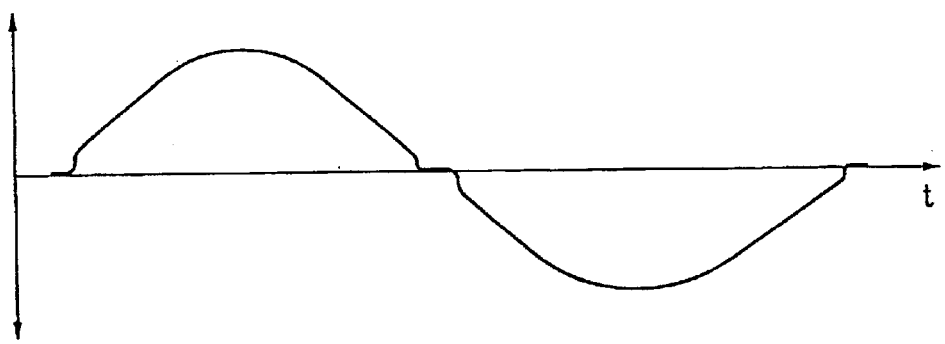
Figure 9:
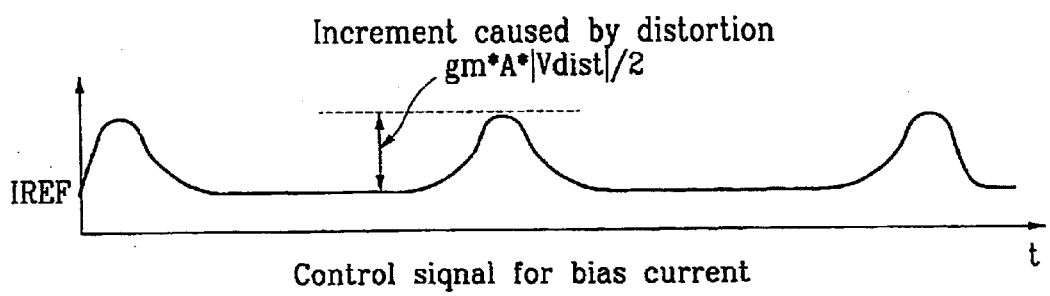
Figure 10:
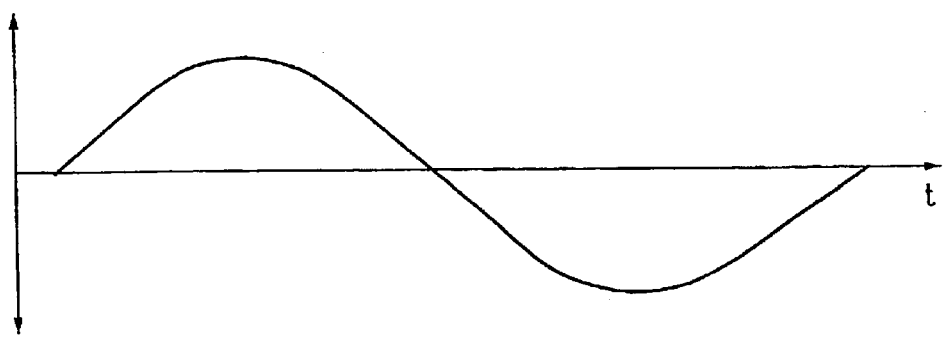

The advantages of the invention are depicted in FIGS. 8–10. FIG. 8 is a graph showing an output waveform of a class AB power amplifier, in which there is crossover distortion in the output. FIG. 9 is a graph showing a bias current waveform generated after the application of an adaptive bias current control circuit. And FIG. 10 is a graph showing the bias current waveform of FIG. 9 following improvements with respect to crossover distortion using a control current.

In the conventional class AB amplifier, distortion is generated because of a predetermined bias current of the output terminal as shown in FIG. 8. By adding the adaptive bias current control circuit 300 of the invention, the bias current is increased in the areas of distortion (as shown in FIG. 9) so that crossover distortion is prevented. Thus, a THD (total harmonic distortion) output as shown in FIG. 10 is obtained. Further, since the adaptive bias current circuit 300 does not operate when there is no distortion or no signal, the amount of power consumed is reduced.

In the power amplifier of the invention structured and operating as described above, an adaptive bias control circuit is applied to the amplifier for increasing current through variable current sources according to distortion signals of the current sources. As a result, distortion is prevented and power consumption is minimized.

Many variations and/or modifications can be made to the aspects of the invention described above. For example, a circuit for a power amplifier having the same advantages may be obtained where the output terminal uses BJTs (bipolar junction transistors). For controlling the bias current of the output terminal, when performing the varying function using voltage or current, a circuit realizing identical results may be easily obtained through slight additions, omissions, or variations in the aspect of the invention described above.

Having described the preferred aspects of the invention, it is understood that the invention defined by the appended claims is not to be limited by particular details set forth in the above description, as many apparent variations thereof are possible without departing from the spirit or scope thereof.

We claim:

1. A semiconductor device containing a power amplifier comprising:

a differential input terminal receiving a first voltage and a second voltage respectively through a first terminal and a second terminal, and outputting a current corresponding to a difference in the input voltages;

an output terminal for outputting an amplified signal corresponding to the current output by the differential input terminal;

a negative feedback circuit for performing negative feedback of an output voltage of the output terminal and providing the output voltage to the first terminal of the differential input terminal; and an adaptive bias current control circuit for controlling a bias current of the output terminal and comprising a distortion sensor, an absolute value circuit, and a distortion signal amplifier.

2. A system containing a power amplifier comprising:

a differential input terminal receiving a first voltage and a second voltage respectively through a first terminal and a second terminal, and outputting a current corresponding to a difference in the input voltages;

an output terminal for outputting an amplified signal corresponding to the current output by the differential input terminal;

a negative feedback circuit for performing negative feedback of an output voltage of the output terminal and providing the output voltage to the first terminal of the differential input terminal; and an adaptive bias current control circuit for controlling a bias current of the output terminal and comprising a distortion sensor, an absolute value circuit, and a distortion signal amplifier.

3. A method for making a power amplifier, comprising:

providing a differential input terminal receiving a first voltage and a second voltage respectively through a first terminal and a second terminal, and outputting a current corresponding to a difference in the input voltages;

providing an output terminal for outputting an amplified signal corresponding to the current output by the differential input terminal;

providing a negative feedback circuit for performing negative feedback of an output voltage of the output terminal and providing the output voltage to the first terminal of the differential input terminal; and providing an adaptive bias current control circuit for controlling a bias current of the output terminal and comprising a distortion sensor, an absolute value circuit, and a distortion signal amplifier.

4. A power amplifier, comprising:

an input terminal receiving two different input voltages and outputting a current corresponding to a difference in the input voltages;

an output terminal outputting an amplified signal corresponding to the current output from the input terminal;

a feedback circuit for performing negative feedback between the output terminal and the input terminal; and a control circuit for controlling the bias current of the output terminal and comprising a distortion sensor, an absolute value circuit, and a distortion signal amplifier.

5. The amplifier of claim 4, wherein the two input voltages are a first voltage and a second voltage that are received through a first terminal and a second terminal.

6. The amplifier of claim 5, wherein the feedback circuit provides the feedback between the output voltage of the output terminal and the first terminal of the input terminal.

7. A semiconductor device containing a power amplifier comprising:

an input terminal receiving two different input voltages and outputting a current corresponding to a difference in the input voltages;

an output terminal outputting an amplified signal corresponding to the current output from the input terminal;

a feedback circuit for performing negative feedback between the output terminal and the input terminal; and a control circuit for controlling the bias current of the output terminal and comprising a distortion sensor, an absolute value circuit, and a distortion signal amplifier.

8. A system containing a power amplifier comprising:

an input terminal receiving two different input voltages and outputting a current corresponding to a difference in the input voltages;

an output terminal outputting an amplified signal corresponding to the current output from the input terminal;

a feedback circuit for performing negative feedback between the output terminal and the input terminal; and a control circuit for controlling the bias current of the output terminal and comprising a distortion sensor, an absolute value circuit, and a distortion signal amplifier.

9. A method for making a power amplifier, comprising:

providing an input terminal receiving two different input voltages and outputting a current corresponding to a difference in the input voltages;

providing an output terminal outputting an amplified signal corresponding to the current output from the input terminal;

providing a feedback circuit for performing negative feedback between the output terminal and the input terminal; and providing a control circuit for controlling the bias current of the output terminal and comprising a distortion sensor, an absolute value circuit, and a distortion signal amplifier.

10. A power amplifier, comprising:

an input terminal receiving an input voltage through an inverting terminal and a different input voltage through a non-inverting terminal and outputting a current corresponding to a difference in the input voltages.

an output terminal outputting an amplified signal corresponding to the current output from the input terminal;

a feedback circuit for performing negative feedback of the output voltage of the output terminal; and a control circuit for controlling the bias current of the output terminal and comprising a distortion sensor, an absolute value circuit, and a distortion signal amplifier.

11. A semiconductor device containing a power amplifier comprising:

an input terminal receiving an input voltage through an inverting terminal and a different input voltage through a non-inverting terminal and outputting a current corresponding to a difference in the input voltages.

an output terminal outputting an amplified signal corresponding to the current output from the input terminal;

a feedback circuit for performing negative feedback of the output voltage of the output terminal; and a control circuit for controlling the bias current of the output terminal and comprising a distortion sensor, an absolute value circuit, and a distortion signal amplifier.

12. A system containing a power amplifier comprising:

an input terminal receiving an input voltage through an inverting terminal and a different input voltage through a non-inverting terminal and outputting a current corresponding to a difference in the input voltages.

an output terminal outputting an amplified signal corresponding to the current output from the input terminal;

a feedback circuit for performing negative feedback of the output voltage of the output terminal; and a control circuit for controlling the bias current of the output terminal and comprising a distortion sensor, an absolute value circuit, and a distortion signal amplifier.

13. A method for making a power amplifier, comprising:

providing an input terminal receiving an input voltage through an inverting terminal and a different input voltage through a non-inverting terminal and outputting a current corresponding to a difference in the input voltages.

providing an output terminal outputting an amplified signal corresponding to the current output from the input terminal;

providing a feedback circuit for performing negative feedback of the output voltage of the output terminal; and providing a control circuit for controlling the bias current of the output terminal and comprising a distortion sensor, an absolute value circuit, and a distortion signal amplifier.

14. A power amplifier comprising:

a differential input terminal receiving a first voltage and a second voltage respectively through a first terminal and a second terminal, and outputting a current corresponding to a difference in the input voltages;

a class AB output terminal for outputting an amplified signal corresponding to the current output by the differential input terminal, wherein the an output transistor unit including first and second transistors, and supplying a current to a load;

first and second variable current sources controlled by the adaptive bias current control circuit;

first and second current sources provided by the differential input terminal;

a first control transistor unit that responds to the first variable current source and the first current source, and controls an input voltage of the first transistor; and a second control transistor unit that responds to the second variable current source and the second current source, and controls the second transistor, wherein the first and second control transistor units control a bias current flowing to the output transistor unit when there is no signal;

a negative feedback circuit for performing negative feedback of an output voltage of the output terminal and providing the output voltage to the first terminal of the differential input terminal; and an adaptive bias current control circuit for controlling a bias current of the output terminal according to distortion information corresponding to the difference between the first voltage and the second voltage.

15. A power amplifier, comprising:

an input terminal for receiving a first input voltage and a different second input voltage and outputting a current corresponding to a difference in the input voltages;

an output terminal outputting an amplified signal corresponding to the current output from the input terminal;

a feedback circuit for performing negative feedback of the output voltage of the output terminal; and a control circuit for controlling the bias current of the output terminal, the control circuit comprising a distortion sensor, an absolute value circuit, and a distortion signal amplifier.

16. The amplifier of claim 15, wherein the distortion sensor obtains distortion information from a difference in the input voltages.

17. The amplifier of claim 16, wherein the absolute value circuit obtains the distortion information from the distortion sensor and then outputs an absolute value of that information.

18. The amplifier of claim 17, wherein the distortion signal amplifier amplifies the absolute value of the output from the absolute value circuit and outputs a control current to control variable current sources within the output terminal.

19. The amplifier of claim 4, wherein the distortion sensor obtains distortion information from a difference in the input voltages.

20. The amplifier of claim 19, wherein the absolute value circuit obtains the distortion information from the distortion sensor and then outputs an absolute value of that information.

21. The amplifier of claim 20, wherein the distortion signal amplifier amplifies the absolute value of the output from the absolute value circuit and outputs a control current to control variable current sources within the output terminal.

22. The amplifier of claim 10, wherein the distortion sensor obtains distortion information from a difference in the input voltages.

23. The amplifier of claim 22, wherein the absolute value circuit obtains the distortion information from the distortion sensor and then outputs an absolute value of that information.

24. The amplifier of claim 23, wherein the distortion signal amplifier amplifies the absolute value of the output from the absolute value circuit and outputs a control current to control variable current sources within the output terminal.

25. A semiconductor device containing a power amplifier, the amplifier comprising:

an input terminal for receiving a first input voltage and a different second input voltage and outputting a current corresponding to a difference in the input voltages;

an output terminal outputting an amplified signal corresponding to the current output from the input terminal;

a feedback circuit for performing negative feedback of the output voltage of the output terminal; and a control circuit for controlling the bias current of the output terminal, the control circuit comprising a distortion sensor, an absolute value circuit, and a distortion signal amplifier.

26. A system containing a power amplifier, the amplifier comprising:

an input terminal for receiving a first input voltage and a different second input voltage and outputting a current corresponding to a difference in the input voltages;

an output terminal outputting an amplified signal corresponding to the current output from the input terminal;

a feedback circuit for performing negative feedback of the output voltage of the output terminal; and a control circuit for controlling the bias current of the output terminal, the control circuit comprising a distortion sensor, an absolute value circuit, and a distortion signal amplifier.

27. A method for making a power amplifier, comprising:

providing an input terminal for receiving a first input voltage and a different second input voltage and outputting a current corresponding to a difference in the input voltages;

providing an output terminal outputting an amplified signal corresponding to the current output from the input terminal;

providing a feedback circuit for performing negative feedback of the output voltage of the output terminal; and providing a control circuit for controlling the bias current of the output terminal, the control circuit comprising a distortion sensor, an absolute value circuit, and a distortion signal amplifier.

28. A power amplifier, comprising:

an input terminal receiving a voltage and outputting a current;

an output terminal outputting an amplified signal corresponding to the current output from the input terminal;

a feedback circuit for performing negative feedback of the output voltage of the output terminal; and a control circuit for controlling the bias current of the output terminal, the control circuit comprising a distortion sensor, an absolute value circuit, and a distortion signal amplifier.

29. A power amplifier, comprising:

an input terminal receiving a voltage and outputting a current;

an output terminal outputting an amplified signal corresponding to the current output from the input terminal;

a feedback circuit for performing negative feedback of the output voltage of the output terminal; and a control circuit for controlling the bias current of the output terminal, the control circuit containing:

a distortion sensor obtaining distortion information from a difference in the input voltages;

an absolute value circuit obtaining the distortion information from the distortion sensor and outputting an absolute value of that information; and a distortion signal amplifier amplifying the absolute value of the output from the absolute value circuit and outputting a control current to control variable current sources within the output terminal.

\* \* \* \* \*